United States Patent
Bouche et al.

(10) Patent No.: US 9,786,545 B1
(45) Date of Patent: Oct. 10, 2017

(54) METHOD OF FORMING ANA REGIONS IN AN INTEGRATED CIRCUIT

(71) Applicant: GLOBALFOUNDRIES Inc., Grand Cayman, KY (US)

(72) Inventors: Guillaume Bouche, Albany, NY (US); Jason Eugene Stephens, Menands, NY (US); Byoung Youp Kim, Schenectady, NY (US); Craig Michael Child, Jr., Gansevoort, NY (US); Shreesh Narasimha, Beacon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/271,519

(22) Filed: Sep. 21, 2016

(51) Int. Cl.
*H01L 21/762* (2006.01)
*H01L 21/311* (2006.01)
*H01L 21/3105* (2006.01)
*H01L 21/768* (2006.01)

(52) U.S. Cl.
CPC .. *H01L 21/76224* (2013.01); *H01L 21/31051* (2013.01); *H01L 21/31133* (2013.01); *H01L 21/31144* (2013.01); *H01L 21/76802* (2013.01); *H01L 21/76877* (2013.01)

(58) Field of Classification Search
CPC ......... H01L 21/76224; H01L 21/31133; H01L 21/76877; H01L 21/31144; H01L 21/76802; H01L 21/31051
USPC ....................................................... 438/424
See application file for complete search history.

(56) References Cited

U.S. PATENT DOCUMENTS

| | | |
|---|---|---|
| 6,455,436 B1 | 9/2002 | Ueda et al. |
| 7,183,142 B2 | 2/2007 | Anderson et al. |
| 8,298,943 B1 * | 10/2012 | Arnold ................ H01L 21/0337 438/667 |
| 8,518,824 B2 | 8/2013 | Arnold et al. |
| 8,999,848 B2 | 4/2015 | Lee et al. |
| 9,012,287 B2 | 4/2015 | Liaw |
| 9,123,656 B1 | 9/2015 | Hsieh et al. |
| 9,136,106 B2 | 9/2015 | Wu et al. |
| 9,209,279 B1 | 12/2015 | Zhang et al. |
| 9,406,775 B1 | 8/2016 | Bouche et al. |

(Continued)

OTHER PUBLICATIONS

U.S. Appl. No. 15/077,384, filed Mar. 22, 2016.
(Continued)

*Primary Examiner* — Caleen Sullivan
(74) *Attorney, Agent, or Firm* — Heslin Rothenberg Farley & Mesiti P.C.

(57) ABSTRACT

A method includes providing a structure having a first hardmask layer, interposer layer, second hardmask layer and mandrel layer disposed respectively over a dielectric stack. An array of mandrels is patterned into the mandrel layer with a mandrel mask. An ANA trench is patterned into the mandrel layer with a first cut mask. The ANA trench is patterned into the interposer layer with a second cut mask. An organic planarization layer (OPL) is disposed over the structure. The OPL is etched to dispose it only in the ANA trench such that a top surface of the OPL is lower than the second hardmask layer. The structure is etched to form a pattern in a dielectric layer of the dielectric stack to form an array of metal lines in the dielectric layer, a portion of the pattern formed by the ANA trench forms an ANA region within the dielectric layer.

20 Claims, 17 Drawing Sheets

(56) References Cited

U.S. PATENT DOCUMENTS

| | | |
|---|---|---|
| 2005/0215040 A1 | 9/2005 | Doyle |
| 2006/0055045 A1 | 3/2006 | Park et al. |
| 2012/0118854 A1 | 5/2012 | Smayling et al. |
| 2013/0196517 A1 | 8/2013 | Tsujita et al. |
| 2013/0244344 A1 | 9/2013 | Malmhall et al. |
| 2013/0329486 A1 | 12/2013 | Juengling |
| 2014/0038428 A1 | 2/2014 | Huang et al. |
| 2014/0054534 A1 | 2/2014 | Pellizzer et al. |
| 2014/0170853 A1 | 6/2014 | Shamma et al. |
| 2014/0258961 A1 | 9/2014 | Ke et al. |
| 2014/0273363 A1 | 9/2014 | Chiu et al. |
| 2014/0273464 A1 | 9/2014 | Shieh et al. |
| 2015/0056800 A1 | 2/2015 | Mebarki et al. |
| 2015/0072527 A1 | 3/2015 | Ng et al. |
| 2015/0087149 A1 | 3/2015 | He et al. |
| 2015/0108087 A1 | 4/2015 | Somervell et al. |
| 2015/0140811 A1* | 5/2015 | Huang ............ H01L 21/3086 438/669 |
| 2015/0147882 A1* | 5/2015 | Yao ............ H01L 21/76879 438/675 |
| 2015/0179652 A1 | 6/2015 | Wang et al. |
| 2015/0243654 A1 | 8/2015 | Zhong et al. |
| 2015/0318173 A1 | 11/2015 | Shih et al. |
| 2015/0339422 A1 | 11/2015 | Greco et al. |
| 2016/0049307 A1 | 2/2016 | Chen |
| 2016/0056075 A1 | 2/2016 | Wei et al. |
| 2016/0056104 A1 | 2/2016 | Bouche et al. |
| 2016/0064248 A1 | 3/2016 | Lee et al. |
| 2016/0086841 A1 | 3/2016 | Song et al. |
| 2016/0099178 A1 | 4/2016 | Zhana et al. |
| 2016/0225634 A1 | 8/2016 | Anderson et al. |
| 2016/0254191 A1 | 9/2016 | Tseng et al. |
| 2017/0221702 A1 | 8/2017 | Lee et al. |

OTHER PUBLICATIONS

U.S. Appl. No. 15/271,475, filed Sep. 21, 2016.
U.S. Appl. No. 15/271,497, filed Sep. 21, 2016.
U.S. Appl. No. 15/141,087, filed Apr. 28, 2016.
U.S. Appl. No. 15/379,605, filed Dec. 15, 2016.
U.S. Appl. No. 15/379,645, filed Dec. 15, 2016.
U.S. Appl. No. 15/379,707, filed Dec. 15, 2016.
U.S. Appl. No. 15/379,740, filed Dec. 15, 2016.
U.S. Appl. No. 15/362,035, filed Nov. 28, 2016.
U.S. Appl. No. 15/053,818, filed Feb. 25, 2016.
U.S. Appl. No. 15/077,480, filed Mar. 22, 2016.
U.S. Appl. No. 15/077,564, filed Mar. 22, 2016.

* cited by examiner

METHOD OF FORMING ANA REGIONS IN AN INTEGRATED CIRCUIT

TECHNICAL FIELD

The present invention relates to semiconductor devices and methods of making the same. More specifically, the invention relates to methods of forming ANA regions in an integrated circuit.

BACKGROUND

Self-aligned double patterning (SADP) techniques, are currently used in back-end-of-the-line (BOEL) construction of ultra-high density integrated circuits to provide an electrical interconnection system which includes multiple arrays of parallel metal lines disposed in several levels of dielectric layers. The dielectric layers are typically interconnected through a system of metalized vias. Conventionally, within an array of metal lines, the direction longitudinal to the metal lines is designated the "Y" direction and the direction perpendicular, or lateral, to the metal lines is designated the "X" direction.

Such SADP techniques typically involve the use of a lithographic mask (designated herein as a "mandrel mask") to pattern and print an array of longitudinally extending parallel mandrels onto a top surface of a hardmask layer. Pairs of self-aligned spacers are then formed on both sidewalls of each mandrel.

Each combination of mandrel and associated spacer pair is separated by exposed parallel portions of the hardmask layer, which are absent any overlaying mandrels or spacers. The mandrels are patterned down into a dielectric layer of the integrated circuit to form mandrel metal lines. The exposed portions of the hardmask layer are also patterned down into the dielectric layer to form non-mandrel metal lines. Therefore, each array of parallel metal lines in an interconnection system formed using an SADP process will include alternating mandrel and non-mandrel metal lines, which are separated by a distance equal to the width of the self-aligned spacers.

In order to provide functionality between devices, such as transistors, capacitors and the like, in the integrated circuit, a plurality of cuts must be lithographically patterned into the mandrel and non-mandrel metal lines of an array at specific locations to direct current flow between the dielectric layers and the devices. Generally, another lithographic mask (designated herein as a "mandrel line cut mask" or "first cut mask") is used to pattern such mandrel cuts into the mandrel metal lines. Also generally yet another lithographic mask (designated herein as a "non-mandrel line cut mask" or "second cut mask") is used to pattern such non-mandrel cuts into the non-mandrel metal lines.

Accordingly, a typical SADP process for patterning arrays of metal lines in a complex interconnection system for an integrated circuit requires at least three masks: a mandrel mask, a mandrel line cut mask, and a non-mandrel line cut mask. Development and use of such masks requires complex, state of the art technology, especially when lithographically printing aggressively small features in such technology class sizes as the 14 nanometer (nm) class and beyond. Therefore it is desirable to keep the number of masks to a minimum due to the large costs associated with the development and use of such masks.

However, there is often a requirement for relatively large planar transition regions between functioning logic blocks where there can be no devices or lines at all. These transition regions are commonly called "ANA regions" (also known as "white regions" or "buffer regions") and are typically between 50 to 100 nanometers (nm) wide and several hundred nm long or more. The ANA regions typically extend longitudinally in the Y direction (parallel to the arrays of metal lines in the plan of the ANA region) or longitudinally in the X direction (perpendicular to the arrays of metal lines in the plan of the ANA region). However, the ANA regions can extend in several different directions and may have complex shapes.

ANA regions are used to provide required separation between different logic blocks, such as a Central Processing Unit (CPU) block, a Static Random Access Memory (SRAM) block or the like, that are designed by different diverse teams during the manufacturing process of a complex integrated circuit. The ANA regions may be required to: prevent electromagnetic interference between blocks, eliminate induced currents between blocks, prevent heat transfer between blocks, provide a buffer space for safety reasons between blocks or the like.

Unfortunately, conventional methods of manufacturing currently require at least one additional ANA mask, and sometimes several different ANA masks, to form the ANA regions on an integrated circuit. These ANA masks are in addition to the mandrel mask, first cut mask and second cut mask utilized in SADP techniques for the formation of metal lines in an interconnection system of an integrated circuit. Each additional ANA mask adds significant cost and labor to the design of the integrated circuit.

Accordingly, there is a need for a method of forming ANA regions on an integrated circuit with a minimum of ANA masks. Additionally, there is a need to eliminate the use of a mask dedicated to just the formation of ANA regions in an integrated circuit. Moreover, there is a need for a method of combining the formation of ANA regions with the formation of metal line cuts utilizing only a first cut mask and a second cut mask.

BRIEF DESCRIPTION

The present invention offers advantages and alternatives over the prior art by providing a method of forming an ANA region with only a first and a second cut mask. No other cut masks are utilized, so the added costs and lithographic tolerance problems of using additional masks for the formation of the ANA regions is avoided.

A method in accordance with one or more aspects of the present invention includes providing a structure having a first hardmask layer, interposer layer, second hardmask layer and mandrel layer disposed respectively over a dielectric stack. An array of mandrels is patterned into the mandrel layer with a mandrel mask. An ANA trench is patterned into the mandrel layer with a first cut mask. The ANA trench is patterned into the interposer layer with a second cut mask. An organic planarization layer (OPL) is disposed over the structure. The OPL is etched to dispose the OPL only in the ANA trench such that a top surface of the OPL is lower than the second hardmask layer. The structure is etched to form a pattern in a dielectric layer of the dielectric stack. An array of alternating mandrel and non-mandrel metal lines is formed from the pattern in the dielectric layer, a portion of the pattern formed by the ANA trench forming an ANA region within the dielectric layer.

In another aspect of the present invention a method includes providing a structure having a first hardmask layer, interposer layer, second hardmask layer and mandrel layer disposed respectively over a dielectric stack. An array of mandrels is patterned into the mandrel layer with a mandrel mask. A beta trench and an ANA trench are patterned into the mandrel layer with a first cut mask. A gamma trench and the ANA trench are patterned into the interposer layer with a second cut mask. An organic planarization layer (OPL) is disposed over the structure. The OPL is etched to dispose the OPL only in the ANA trench. The structure is etched to form a pattern in the dielectric stack. An array of metal lines is formed from the pattern in the dielectric stack, a portion of the pattern formed by the ANA trench forming an ANA region within the dielectric stack.

DRAWINGS

The invention will be more fully understood from the following detailed description taken in conjunction with the accompanying drawings, in which.

Figure 15B:
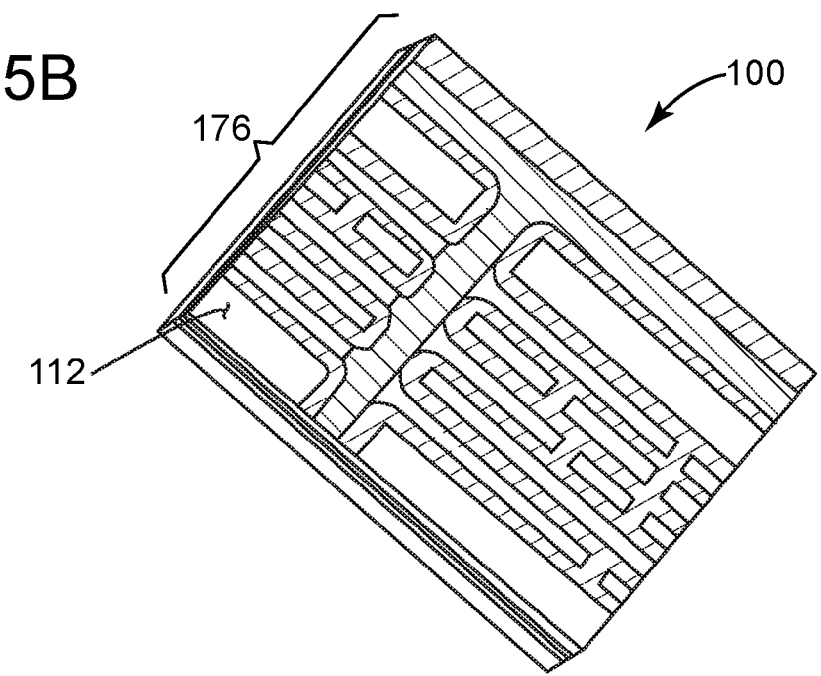
FIG. 15B is a top perspective view of FIG. 15A.
Figure 15A:
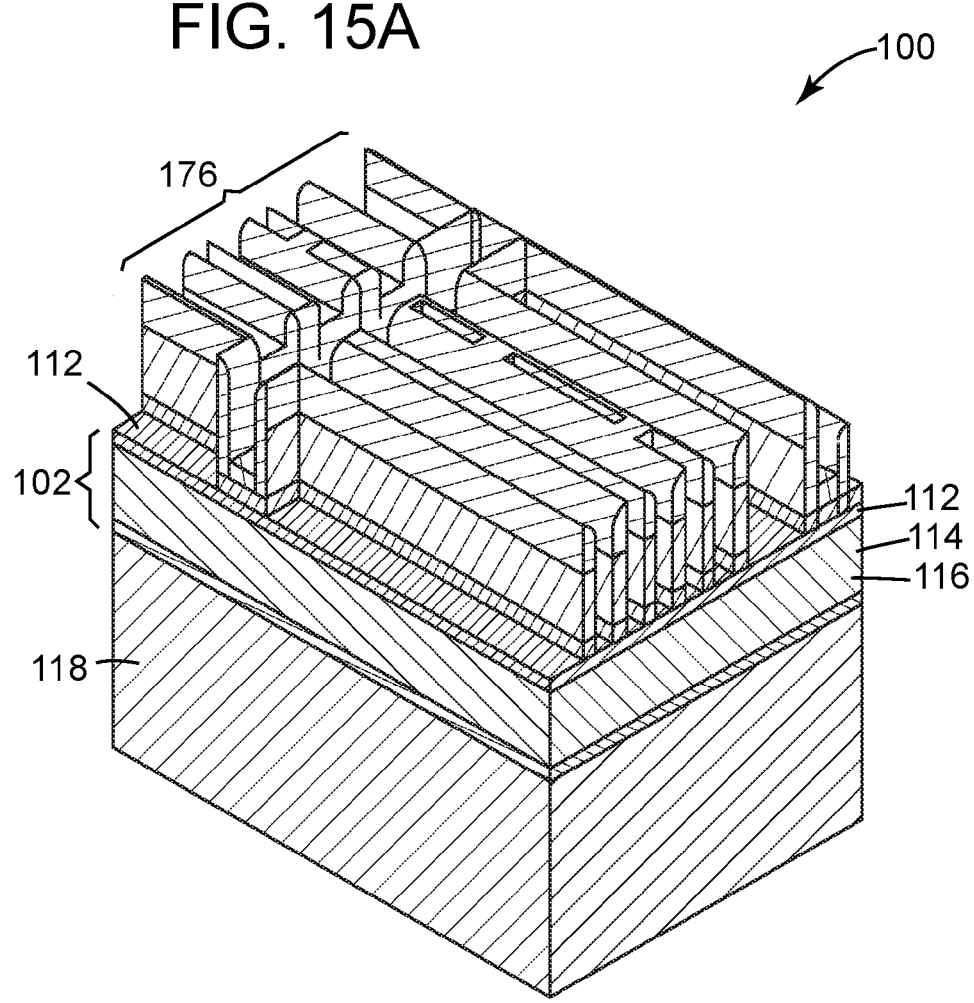
FIG. 15A is a perspective view of the structure of FIG. 14A having the exposed portion of the first hardmask layer anisotropically etched away in accordance with the present invention.
Figure 16:
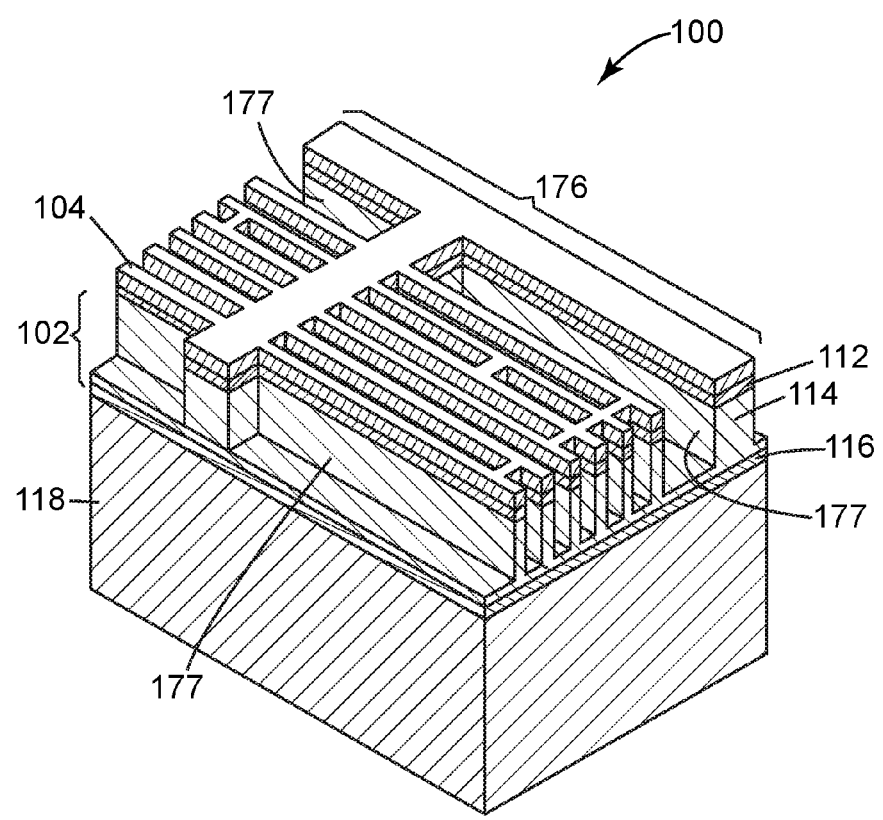
Figure 17:
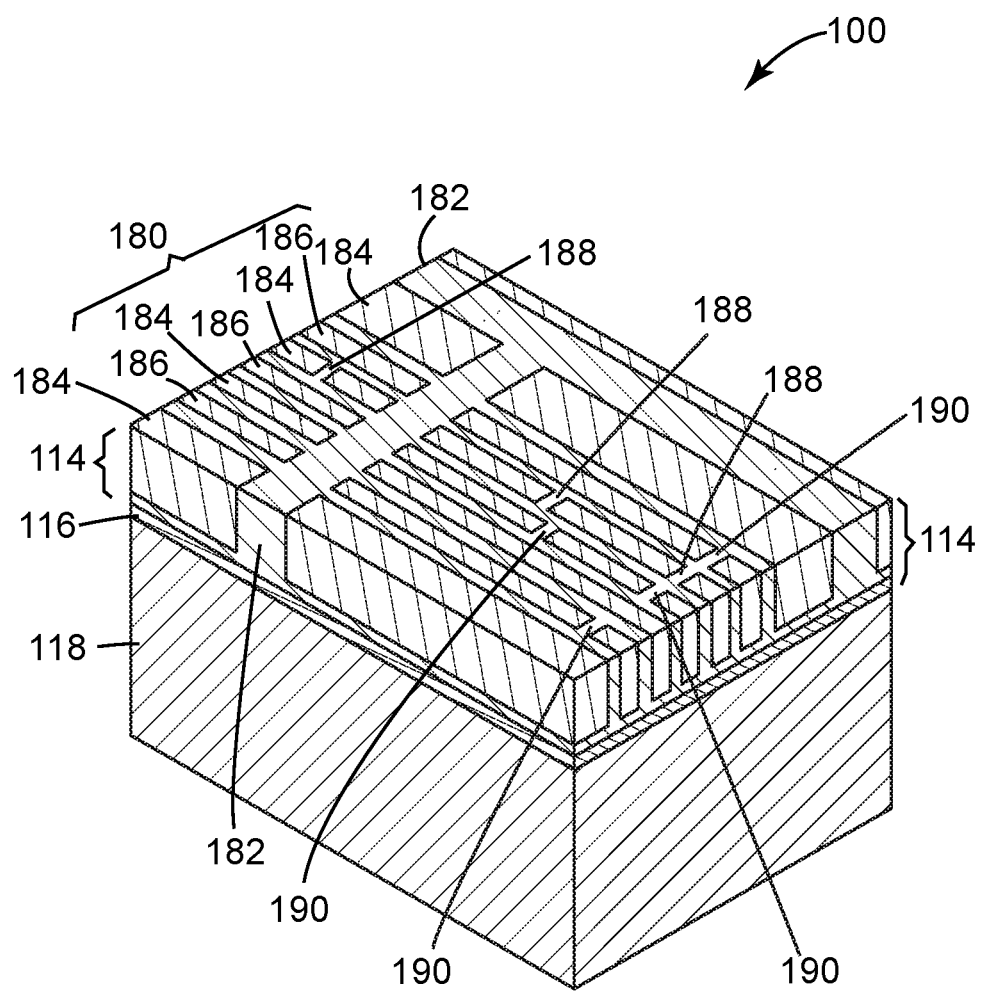

FIG. 16 is a perspective view of the structure of FIG. 15A having the pattern etched into a dielectric layer of the dielectric stack to form an array of metallization trenches in accordance with the present invention; and FIG. 17 is a perspective view of the structure of FIG. 16 having a metal layer disposed and planarized into the metallization trenches to for an array of alternating mandrel and non-mandrel metal lines and an ANA region in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1-17 illustrate various exemplary embodiments of methods of forming ANA regions in an integrated circuit in accordance with the present invention.

Figure 1:
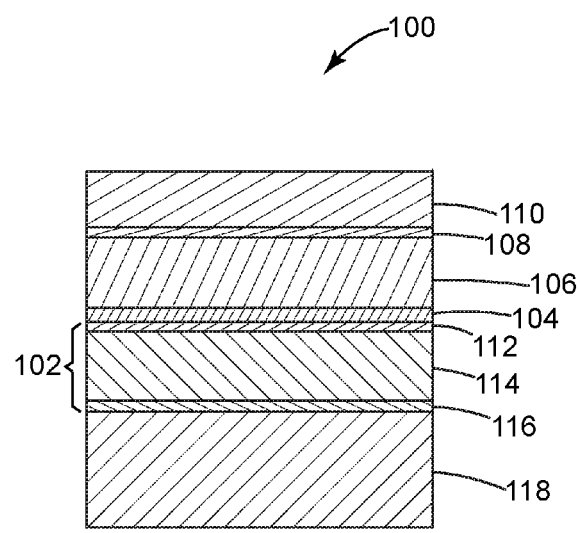
FIG. 1 is a simplified side view of an exemplary embodiment of a structure for an integrated circuit device at an intermediate stage of manufacturing having a first hardmask layer, interposer layer, second hardmask layer and mandrel layer disposed respectively over a dielectric stack in accordance with the present invention.

Referring to FIG. 1, a simplified view of an exemplary embodiment of a structure 100 for an integrated circuit device in accordance with the present invention is presented at an intermediate stage of manufacturing. Structure 100 includes first hardmask layer 104, an interposer layer 106, a second hardmask layer 108 and a mandrel layer 110 disposed respectively over a dielectric stack 102. The first hardmask layer 104 may be composed of a titanium nitride (TiN) or similar. The interposer layer 106 may be composed of a spin-on-hardmask (SOH), which is typically made of an amorphous carbon or similar. The second hardmask layer 108 may be composed of a silicon nitride (SiN) or similar. The mandrel layer 110 may be composed of an amorphous silicon (a-Si) or similar.

The dielectric stack 102 may include many different combinations of layers depending on such factors as application requirements, cost, design preferences and the like. In this exemplary embodiment, the dielectric stack 102 includes a silicon oxynitride dielectric layer (SiON dielectric layer) 112 disposed over a low dielectric constant (k) layer 114, such as a dielectric layer composed of various combinations of silicon, carbon, oxygen and hydrogen (an SiCOH layer). The low k dielectric layer 114 is disposed over an etch-stop layer 116, such as a silicon nitride (SiN) layer, which is also included in the dielectric stack 102.

The dielectric stack 104 is disposed over a complex stack of buried layers 118 from the substrate (not shown) upwards. The buried layers 118 may also include other etch stop layers and metallization layers (not shown).

Figure 2:
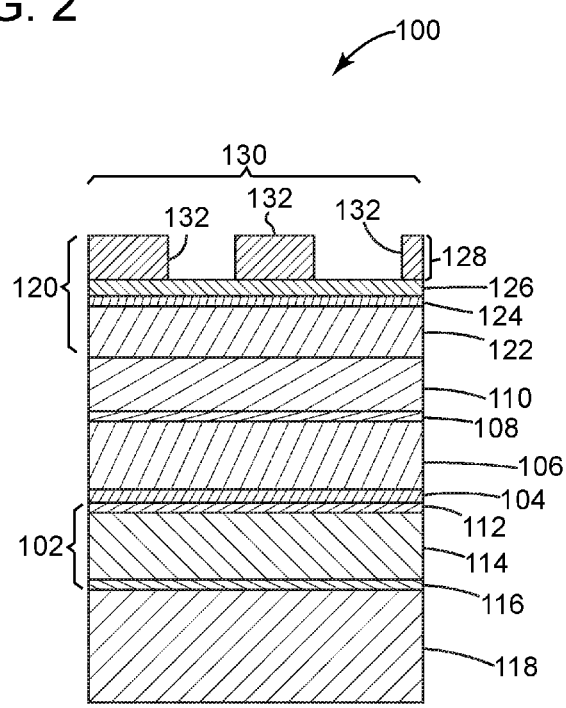
FIG. 2 is a side view of an exemplary embodiment of the structure of FIG. 1 having a first mandrel lithographic stack with mandrels patterned thereon in accordance with the present invention.

Referring to FIG. 2, the next step is to dispose a mandrel lithographic stack 120 onto the mandrel layer 110. The mandrel lithographic stack 120 can be composed of several different kinds of layers, depending on such parameters as the application requirements, design or proprietary preferences or the like. One such stack of layers includes a stack of four thin films which includes (from top to bottom) a resist layer 128, a bottom antireflective coating (BARC) layer 126, a second SiON dielectric layer 124 and a second spin-on hardmask (SOH) layer 122. This SOH layer 122 is typically made of an amorphous carbon. Once the mandrel stack 120 is disposed over the mandrel layer 110, a mandrel mask (not shown) is used to pattern and print a parallel array 130 of mandrels 132 into the resist layer 128 of the mandrel lithographic stack 120 through well-known lithographic techniques.

Figure 3:
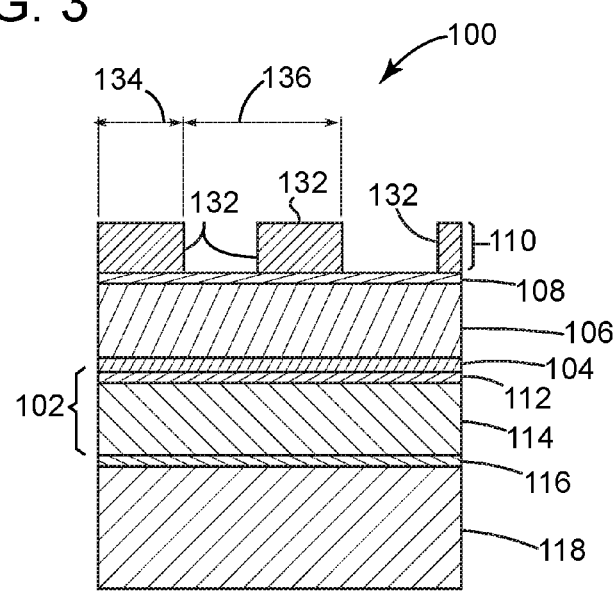
FIG. 3 is a side view of an exemplary embodiment of the structure of FIG. 2 having the mandrels patterned into the mandrel layer.

Referring to FIG. 3, the mandrels 132 are then etched down and trimmed, by a variety of well-known processes, to reduce the width (indicated by arrow 134) of the mandrels 132 to, in this example, substantially 20 nm and to translate the mandrels down into the mandrel layer 110. At this stage of the process flow, the pitch 136 (i.e., the distance between repetitive features on an integrated circuit) in this exemplary embodiment is set at substantially of 80 nm. The mandrels 132 will ultimately be utilized to form an array 180 of alternating mandrel metal lines 184 and non-mandrel metal lines 186 (best seen in FIG. 17) in the low-k dielectric layer 114.

For purposes of clarity, any feature herein, such as a spacer, a trench, a mandrel or the like, that is etched down (i.e., formed or patterned) from an original feature will be referred to as such original feature if it has the same form and function as the original feature. However, it is well-known that the etched down feature will be a translation of the original feature and will be composed of remnants of the various layers involved in the etching process. More specifically, in the case of the mandrels 132, the original mandrels 132 were etched into and may be composed of resist layer 128 and BARC layer 126 (best seen in FIG. 2). However, once the mandrels 132 have been etched down and translated into mandrel layer 110, the mandrels 132 may be composed primarily of the material of the mandrel layer 110 (best seen in FIG. 3).

Figure 4:
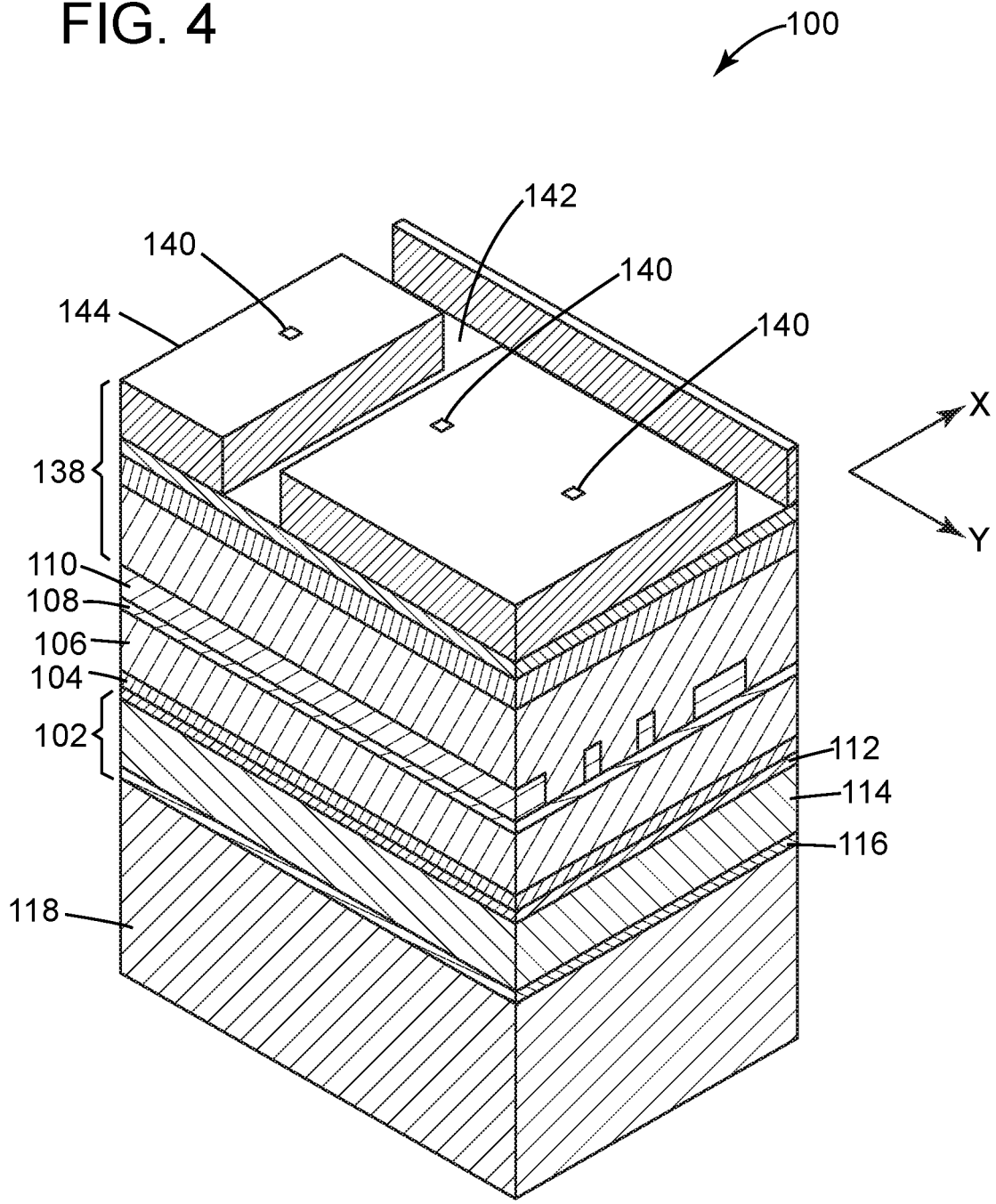
FIG. 4 is a perspective view of an exemplary embodiment of the structure of FIG. 3 having a beta lithographic stack with beta openings and a beta ANA opening patterned therein in accordance with the present invention.

Referring to FIG. 4, a beta lithographic stack 138 is disposed over the structure 100. Next a first cut mask, also known as a mandrel line cut mask, (not shown) is used to pattern and print beta openings 140 and much larger beta ANA opening 142 into a predetermined location of resist layer 144 of stack 138.

In this exemplary embodiment, the beta ANA opening 142 extends in both the Y direction (parallel to the mandrels) and the X direction (perpendicular to the mandrels). The beta ANA opening 142 is typically 50 to 100 nm wide and may be several hundred nanometers (nm) long or more. By comparison, the beta openings 140 are in the order of 20 nm wide in the Y direction and less than the pitch 136 of 80 nm long in the X direction. As such, the beta ANA opening 142, and ultimately the ANA region could extend across the entire array 130 of mandrels 132 in both the X and Y directions.

Though this embodiment shows the structure 100 having beta ANA opening 142 extending in both the X and Y directions and also having several beta openings 140, one skilled in the art would recognize that other combinations of beta ANA openings and beta openings can be patterned into the resist layer 144 with the first cut mask. That is, the beta ANA opening 142 may only extend in either the X or Y directions, or may extend at an acute angle relative to the X and Y directions. Additionally, the beta ANA opening may have a more complex shape than illustrated. Further, the beta openings 140 may not be patterned into the resist layer 144 at all. The beta openings 140 will ultimately be utilized to form mandrel line cuts 188 (best seen in FIG. 17) in selected mandrel lines 184 of the array 180 of alternating mandrel and non-mandrel metal lines 184, 186 disposed in the low k dielectric layer 114.

Figure 5:
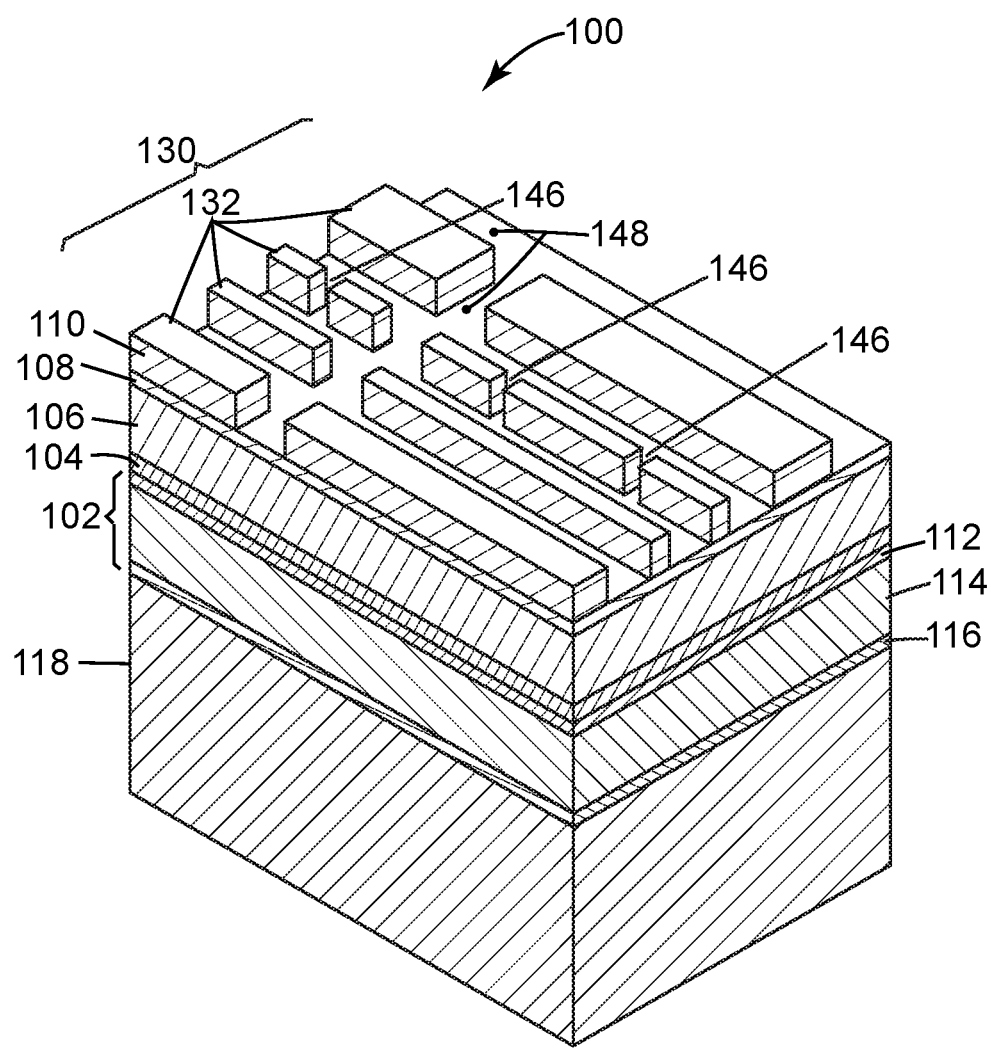
FIG. 5 is a perspective view of an exemplary embodiment of the structure of FIG. 4 having beta trenches and an ANA trench patterned into the mandrel layer 110 in accordance with the present invention.

Referring to FIG. 5, once the lithographic process is complete and the beta openings 140 and beta ANA opening 142 are notched into the resist layer 144, an anisotropic etch process, such as a reactive ion etch (RIE), is utilized to selectively etch down the beta openings 140 to form beta trenches 146 disposed in mandrels 132 of the array 130. The same anisotropic etch process is also used to etch down and translate the beta ANA opening 142 to pattern the ANA trench 148 disposed in the mandrel layer 110. The beta trenches 146 will eventually be further patterned down to the low k dielectric layer 114 to form the mandrel line cuts 184 discussed earlier. The ANA trench 148 will be patterned down to form the ANA region 182 in the low k dielectric layer 114 (best seen in FIG. 17).

Figure 6:
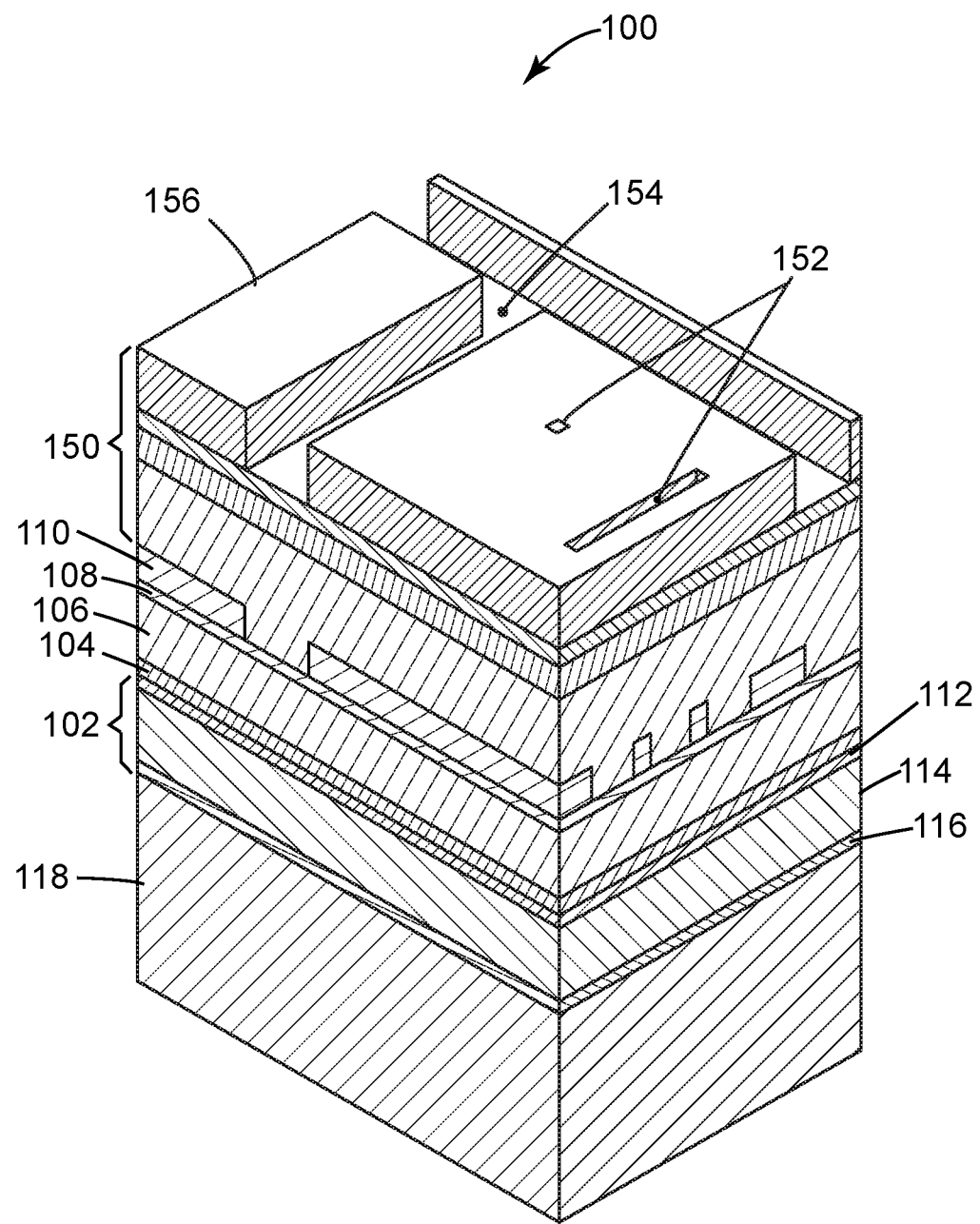
FIG. 6 is a perspective view of an exemplary embodiment of the structure of FIG. 5 having a gamma lithographic stack with gamma openings and a gamma ANA opening patterned therein in accordance with the present invention.

Referring to FIG. 6, a gamma lithographic stack 150 is disposed over the structure 100. Next a second cut mask, also known as a non-mandrel line cut mask, (not shown) is used to pattern and print gamma openings 152 and much larger gamma ANA openings 154 into predetermined locations of resist layer 156 of the stack 150.

It is important to note that the gamma ANA opening 154 directly overlays the entire ANA trench 148, which is currently disposed in the mandrel layer 110 at this stage of the process flow. The gamma ANA opening 154 is also substantially the same size and shape as the ANA trench 148.

The gamma openings 152 extend over the regions of the second hardmask layer 108 and interposer layer 106 that are located between the mandrels 132. The gamma openings 152 are of the same order of magnitude size as that of the beta openings 140 and, therefore, are much smaller than the gamma ANA opening 154.

Though this embodiment shows structure 100 having several gamma openings 152, one skilled in the art would recognize that any number of gamma openings 152 may be patterned into the resist layer 156 with the second cut mask. Alternatively, the gamma openings 152 may not be patterned into the resist layer 156 at all. The gamma openings 152 will ultimately be utilized to form non-mandrel line cuts 190 (best seen in FIG. 17) in selected non-mandrel lines 186 of the array 180 of alternating mandrel and non-mandrel metal lines 184, 186 disposed in the low k dielectric layer 114.

Figure 7B:
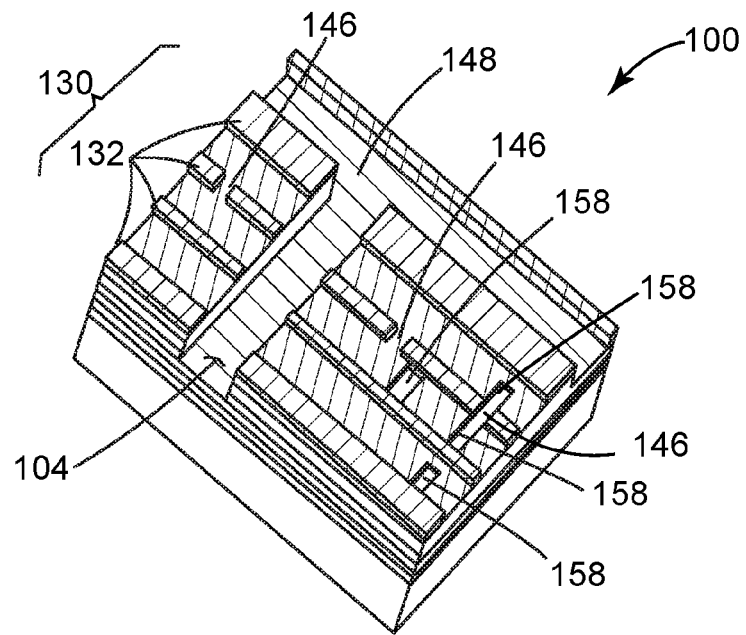
FIG. 7B is a perspective top view of FIG. 7A.
Figure 7A:
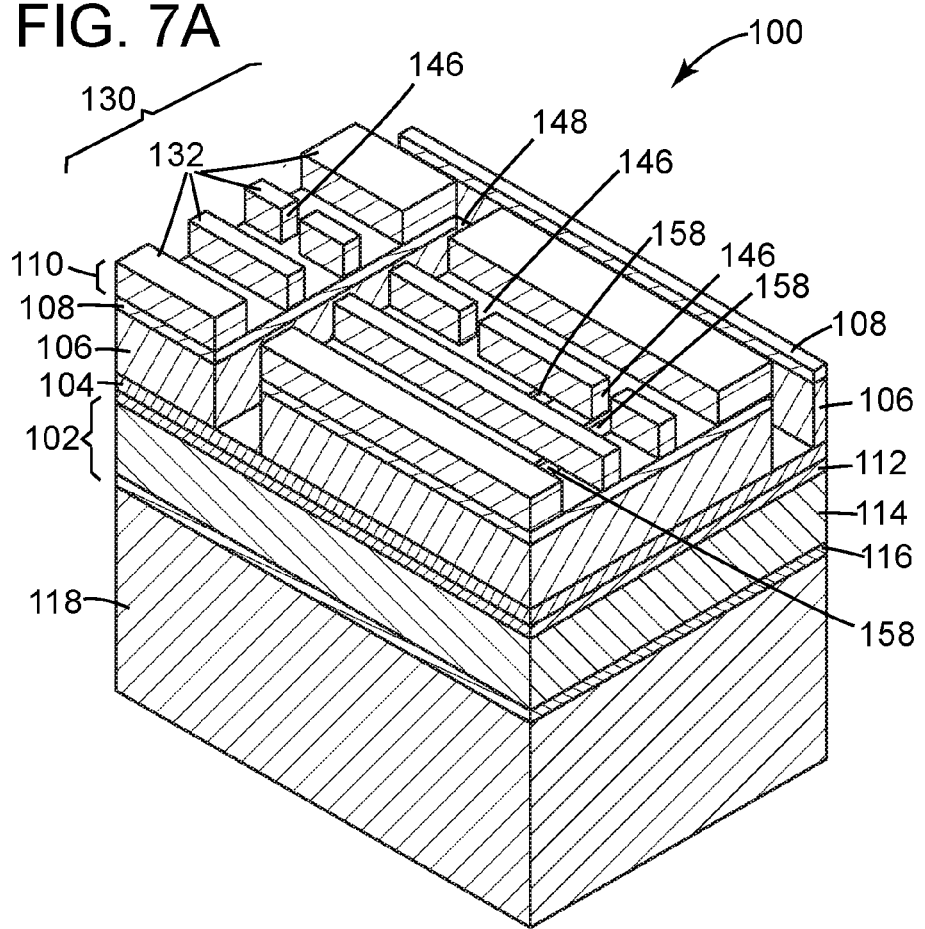
FIG. 7A is a perspective view of an exemplary embodiment of the structure of FIG. 6 having gamma trenches and the ANA trench patterned into the interposer layer in accordance with the present invention.

Referring to FIGS. 7A and 7B, next an anisotropic etch process, such as a reactive ion etch (RIE), utilizes the gamma ANA opening 154 to translate down the ANA trench 148 from the mandrel layer 110, past the second hardmask layer 108 and into the interposer layer 106. The etch process stops when the first hardmask layer 104 is exposed as the bottom of the ANA trench 148.

That same anisotropic etch process is also used to etch down the gamma openings 152 to form gamma trenches 158 into the interposer layer 106 between the mandrels 132 of the mandrel layer 110. The gamma trenches 158, like the ANA trench 148, are etched down to the first hardmask layer 104.

Figure 8:
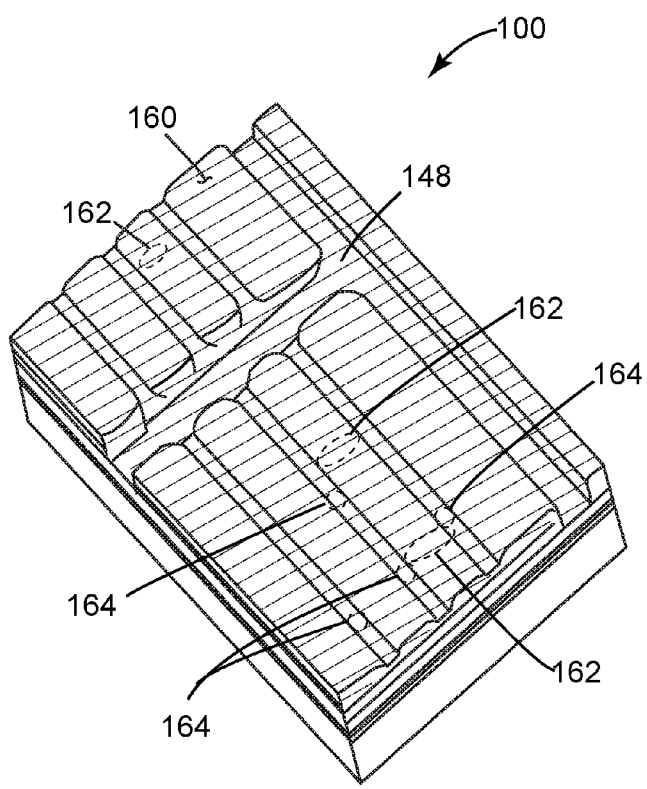
FIG. 8 is a perspective view of the structure of FIG. 7A having a spacer layer disposed thereon in accordance with the present invention.

Referring to FIG. 8, next a spacer layer 160, having a substantially uniform spacer layer thickness, is disposed over the structure 100. The spacer layer 160, in this example, is a silicon nitride (SiN) thin film, which is conformally coated over the entire structure 100. However, the spacer layer may also be other suitable materials such as another nitride, an oxide, such as titanium oxide (TiO2), or similar.

It is important to note that the spacer layer 160 fills the narrow beta trenches 146 and gamma trenches 158 but does not fill the wider ANA trench 148. Therefore beta trench plugs 162 are formed in the beta trenches 146, which extend in the X direction laterally across the mandrels 132. Also gamma trench plugs 164 are formed in the gamma trenches 158, which extend in the X direction laterally between the mandrels.

By contrast, the ANA trench 148, due to its larger width and length, is not plugged. Rather the spacer layer 160 conformally coats the floor of the ANA trench 148 (i.e., the top surface of the first hardmask layer 104) without filling or plugging the ANA trench 148.

The spacer layer 160 can be applied by a deposition process, such as an atomic layer deposition (ALD) process, which can precisely control the spacer layer thickness. In this embodiment, the spacer layer thickness is controlled to substantially 20 nm.

Figure 9:
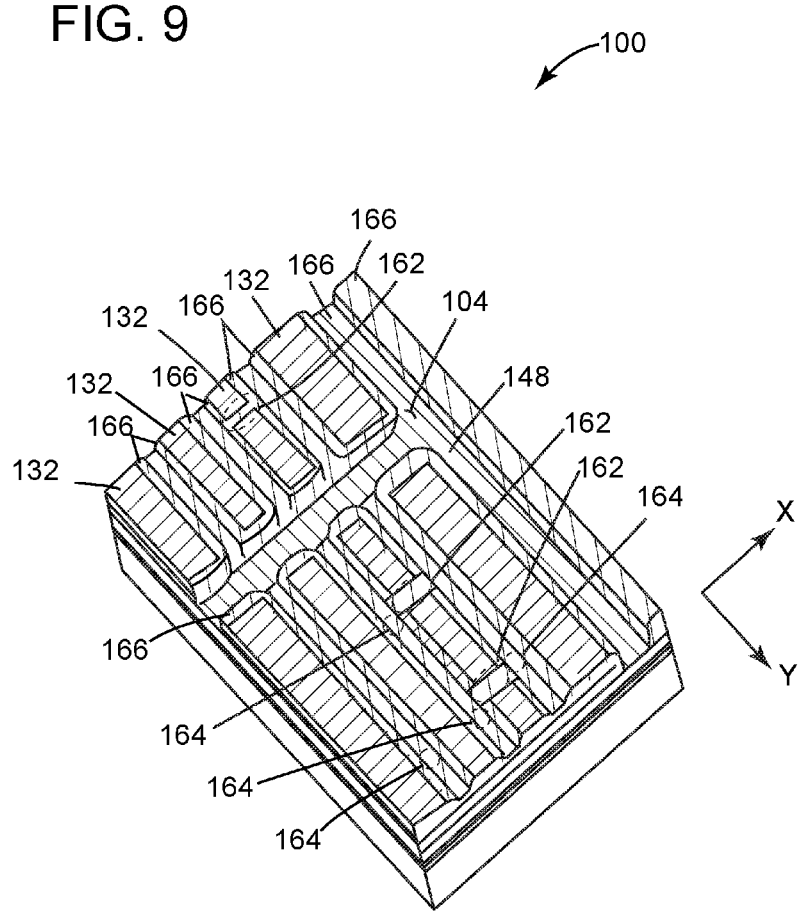
FIG. 9 is a perspective view of the structure of FIG. 8 having the spacer layer anisotropically etched in accordance with the present invention.

Referring to FIG. 9, the spacer layer 160 is anisotropically etched, such as by a RIE process, to expose the top surface of the first hardmask layer 104 within the ANA trench and to expose the upper surface of the mandrels 132. The beta trenches 146 remain plugged with the beta trench plugs 162 and the gamma trenches 158 remain plugged with the gamma trench plugs 164.

Further the anisotropic etching process forms an array of first spacers 166 disposed on sidewalls of the mandrels 132 and on sidewalls of the ANA trench 148. Since the anisotropic etching process etches in the vertical direction only, the remaining first spacers have a spacer width that is substantially equal to the original spacer layer thickness of 20 nm. Additionally, since the spacing between the spacers 166 is defined by the existing structure of the sidewalls of the mandrels 132, the spacers 166 are considered to be self-aligned in the X direction.

As will be explained in greater detail herein, the formation of the beta and gamma trench plugs 162, 164 inverts the geometry of the beta and gamma trenches 146, 158, which enable the formation of mandrel and non-mandrel line cuts 188, 190 (best seen in FIG. 17.) The formation of the ANA trench 148 will be used to form the ANA regions, but at this stage of the process flow, the ANA trench is not inverted. Rather, the first hardmask layer 104 is exposed at the bottom of the ANA trench 148 due to the etching process that was required for formation of spacers 166. Accordingly, in order to utilize the ANA trench 148 in the formation of the ANA region, the exposed first hardmask layer 104 must be recoated with a sacrificial material without coating any other features in structure 100.

Figure 10:
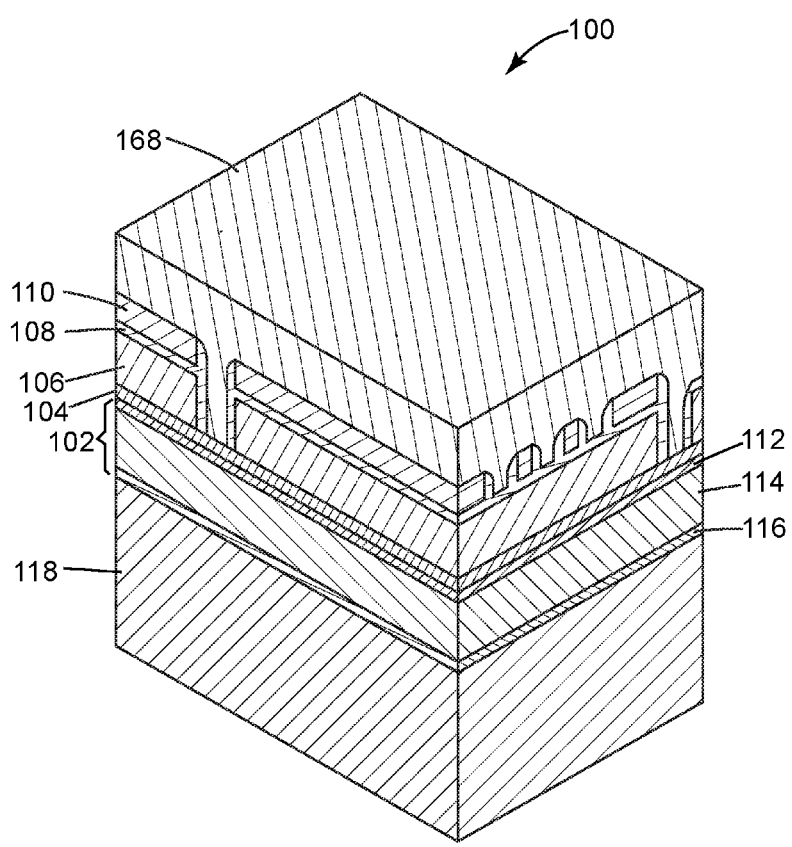
FIG. 10 is a perspective view of the structure of FIG. 9 having an organic planarization layer (OPL) disposed therein in accordance with the present invention.

Referring to FIG. 10, an organic planarization layer (OPL) is disposed over the entire structure 100. The OPL may be deposited using a spin-on deposition process.

It is desirable that the OPL have certain properties. For example, the OPL is sacrificial, so it should be a material that can be removed easily without damaging the surrounding structure. The OPL should have good "gap-fill" properties so that it can fill trenches with aspect ratios of 3 or greater. The OPL should be self planarizing. Also the OPL should be composed of a material that is easily etch selective relative to the material in the spacers 166 (in this example SiN), the material of the interposer layer 106 (in this example an amorphous carbon) and the material of the mandrels (in this example a-Si). To meet these properties, the OPL should be an organic material such as a resist material, another amorphous carbon other than that of the interposer layer material or similar. One such preferred material which has these properties is made by Honeywell International, Inc. and has the tradename "DUO™".

Figure 11B:
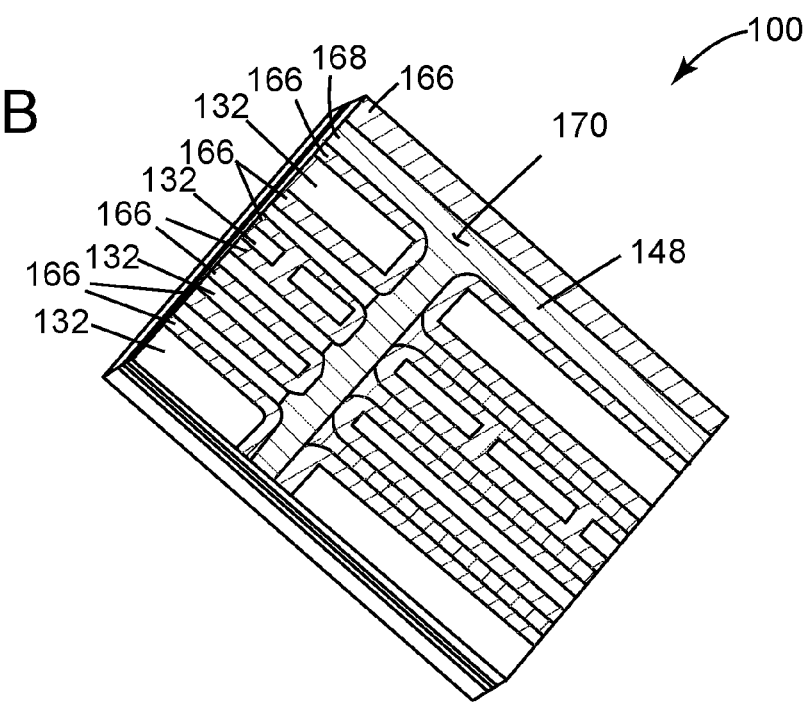
FIG. 11B is a perspective top view of FIG. 11A.
Figure 11A:
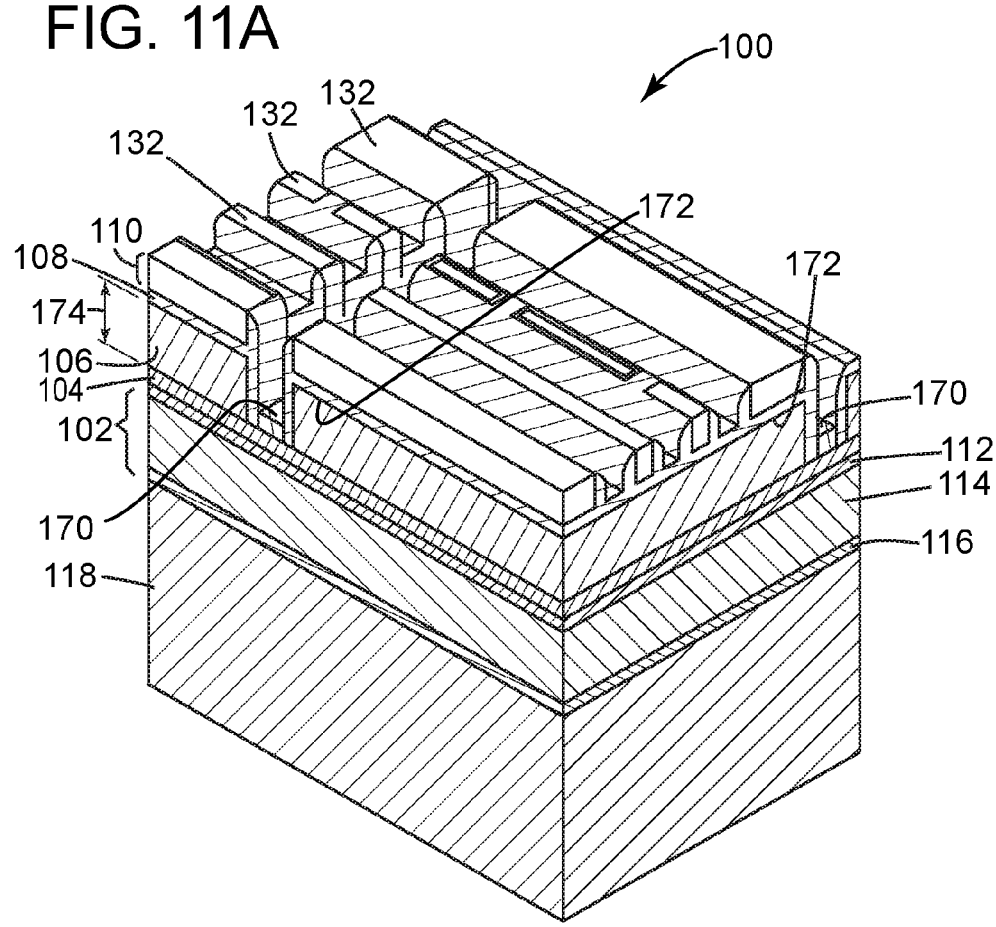
FIG. 11A is a perspective view of the structure of FIG. 10 having the OPL layer etched into the ANA trench only in accordance with the present invention.

Referring to FIGS. 11A and 11B, the OPL 168 is etched back in a controlled manner, such as with an RIE process. The OPL 168 is etched back such that it is disposed only in the ANA trench 148 such that a top surface 170 of the OPL 168 is lower than the second hardmask layer 108 and preferably lower than a bottom surface 172 of the second hardmask layer.

The requirement to be able to recess back the OPL 168 below the level of the second hardmask layer 108 in a controlled fashion also is a primary factor in determining the thickness 174 of the interposer layer 106. That is, the interposer layer 106 must have a predetermined thickness 174 that is thick enough to enable the OPL to be etched in a controlled manner such that:
  a. the OPL is removed from the entire structure 100 except from that of the ANA trench 148;
  b. The top surface 170 of the OPL 168 is lower than the bottom surface 172 of the second hardmask layer 108; and
  c. no portion of the first hardmask layer 104 at the bottom of the ANA trench 148 is exposed.

The thickness 174 of the interposer layer 106 must also be thick enough to allow for safety factor due to manufacturing and process tolerances during the etching process.

Figure 12B:
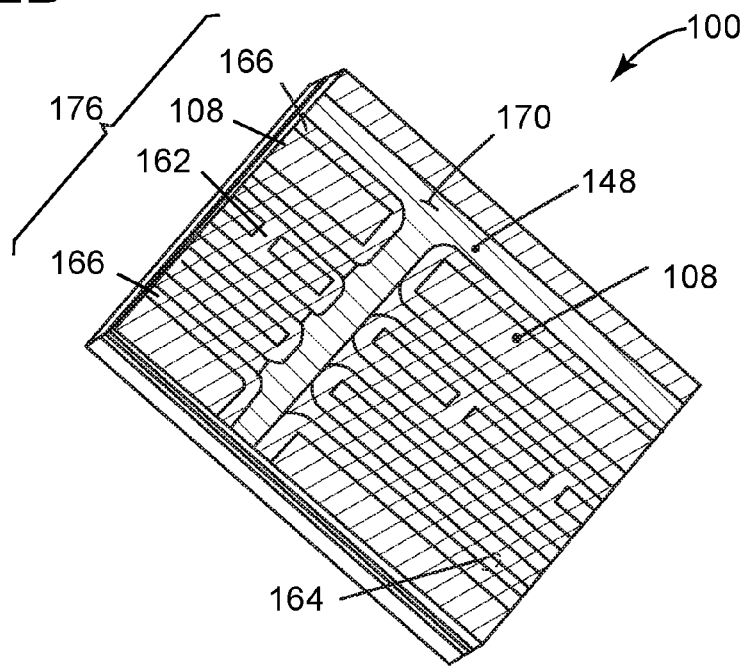
FIG. 12B is a top perspective view of FIG. 12A.
Figure 12A:
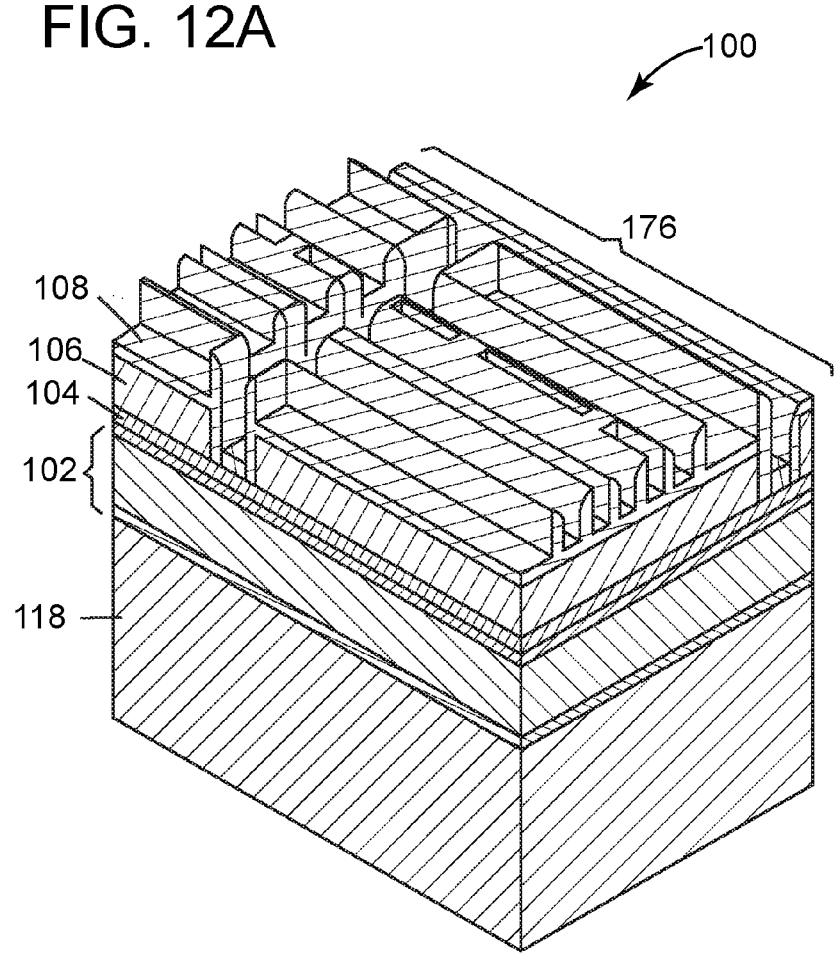
FIG. 12A is a perspective view of the structure of FIG. 11A having the mandrels anisotropically etched away to form a pattern in accordance with the present invention.

Referring to FIGS. 12A and 12B, the a-Si mandrels 146 are selectively etched away, leaving only the spacers 166, the beta trench plugs 162, the gamma trench plugs 164, the OPL 168 plugged ANA trench 148 and the exposed portions of the second hardmask layer 108. The result of the etching process is that a pattern 176 of array 180 (best seen in FIG. 17) has emerged over the second hardmask layer 108

Figure 13B:
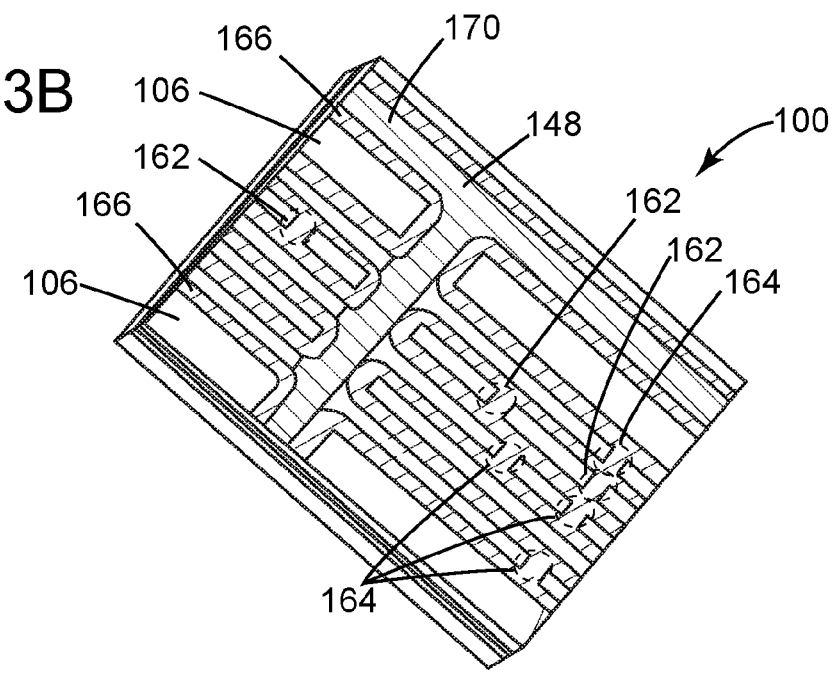
FIG. 13B is a top perspective view of FIG. 13A.
Figure 13A:
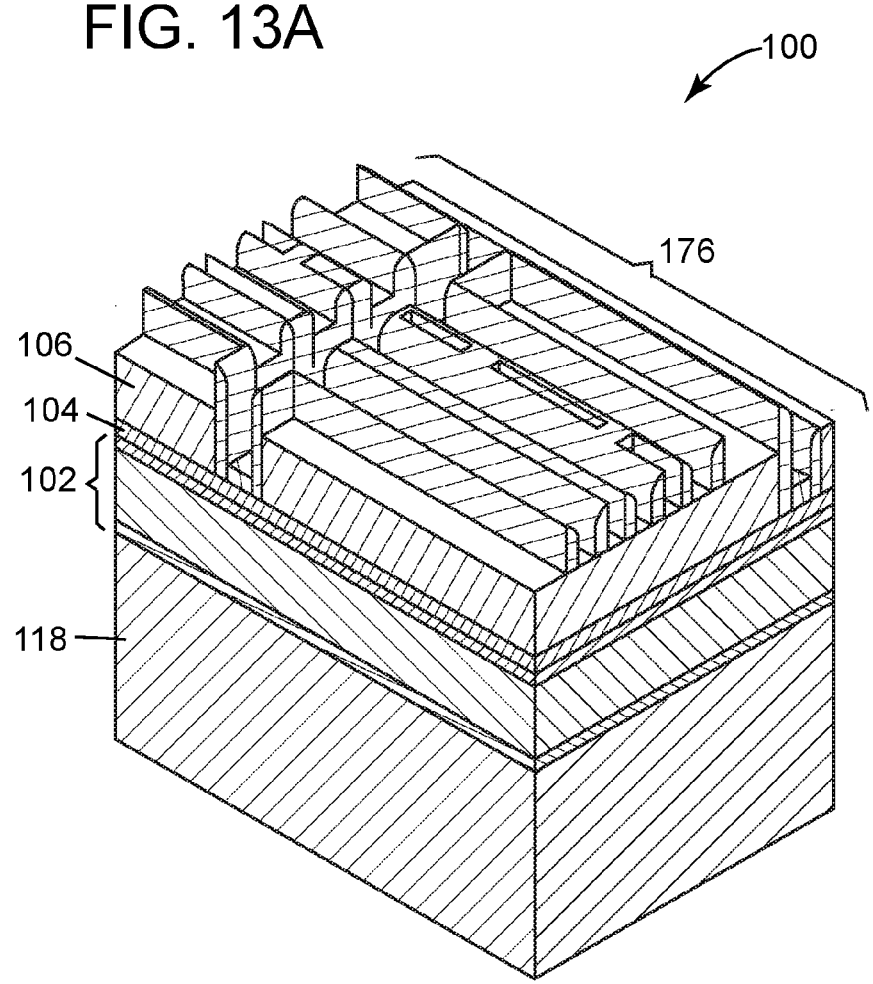
FIG. 13A is a top perspective view of the structure of FIG. 12A having the exposed portion of the second hardmask layer etched away in accordance with the present invention.

Referring to FIGS. 13A and 13B, the second hardmask layer 108 is anisotropically etched away as with a RIE process. Because, in this example, the second hardmask layer 108 and spacers 166 are composed of the same material (SiN), the etch process must be carefully controlled such that the second hardmask layer 108 is etched to expose the interposer layer 106 without etching away the spacers 166. This can be done because the spacers 166 are taller than the second hardmask layer 108 is thick. Therefore, when the etching process punches through the second hardmask layer 108 to the interposer layer 106, the spacers 166 will be recessed but not removed.

Figure 14B:
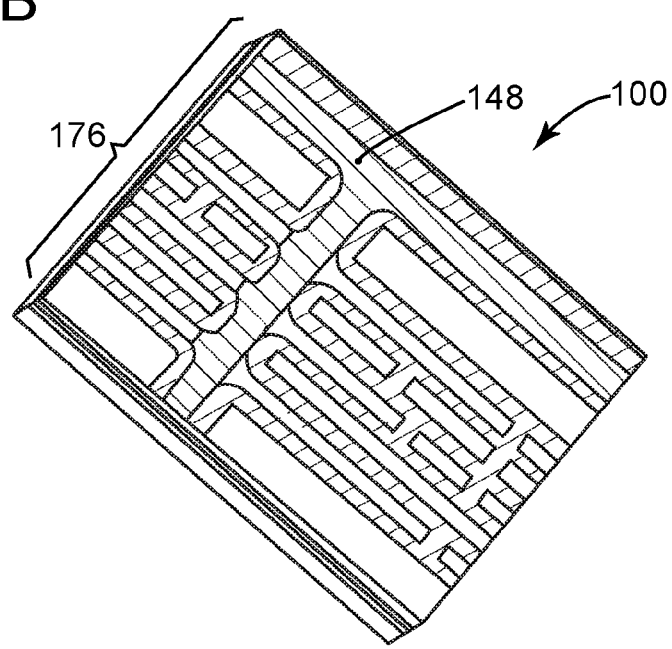
FIG. 14B is a top perspective view of FIG. 14A.
Figure 14A:
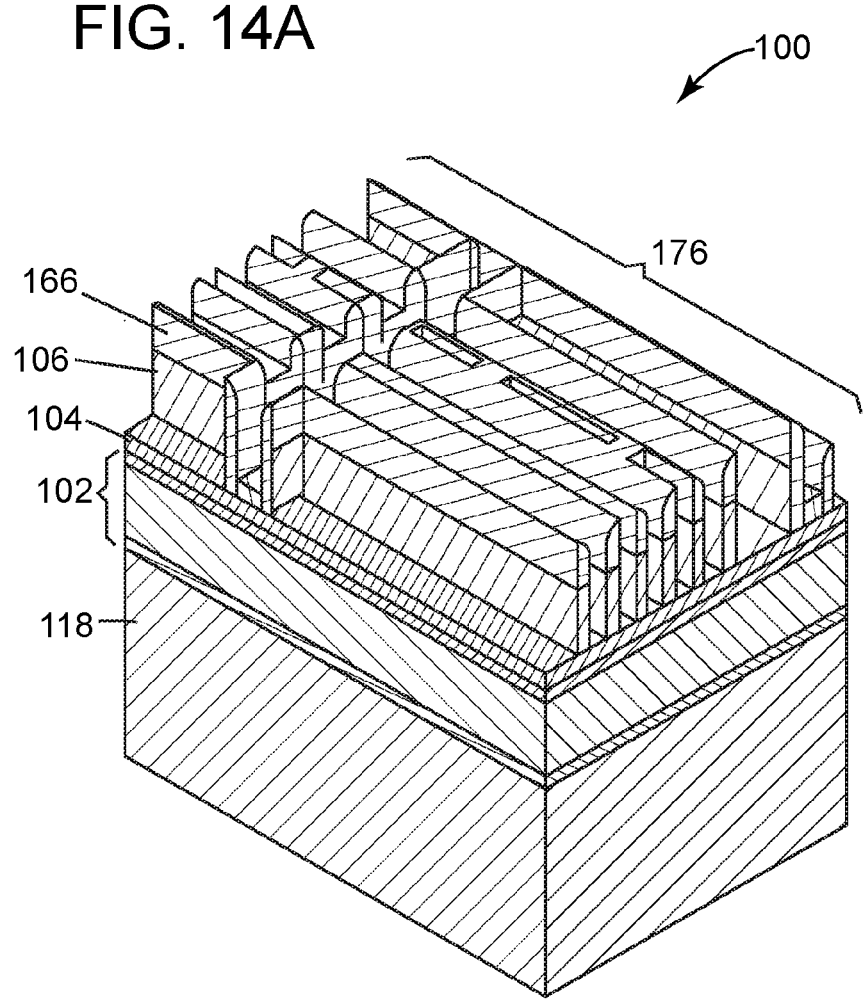
FIG. 14A is a perspective view of the structure of FIG. 13A having the exposed portion of the interposer layer anisotropically etched away in accordance with the present invention.

Referring to FIGS. 14A and 14B, the SOH material of the interposer layer 106 is next anisotropically etched away to expose the first hardmask layer 104. Again, this may be done by a RIE process.

Referring to FIGS. 15A and 15B, the TiN of the first hardmask layer 104 is anisotropically etched away to dispose the pattern 176 directly into the first hardmask layer 104 and over the SION dielectric layer 112 of the dielectric stack 102. Again, this may be done by a RIE process.

An added benefit to this method of forming the pattern 176 is that the sequential selective etching to remove the mandrels 132, the second dielectric layer 108, the interposer layer 106 and the first hardmask layer 104 may be accomplished in a single integrated etch process. That is, through well-known RIE techniques, the composition of the reactive plasma of the RIE process can be changed as it penetrates through the mandrels 132, the second hardmask layer 108, the interposer layer 106 and the first hardmask layer 104 to stop at the SION dielectric layer 116 at the top of the dielectric stack 102.

Referring to FIG. 16, the material above the TiN first hardmask layer 104 is stripped away by well know processes. An anisotropic etching process then utilizes the pattern 176 to form metallization trenches 177 in the low k dielectic layer 114 of the dielectric stack.

Referring to FIG. 17, a metal layer 178 has been disposed over structure 100 and planarized down to expose the metal array 180. Metal array 180 includes a plurality of mandrel metal lines 184 alternating with non-mandrel metal lines 186. The mandrel and non-mandrel metal lines 184, 186 were formed utilizing one mandrel mask on the mandrel lithographic stack 120 as discussed in reference to FIG. 3.

Select mandrel metal lines 184 have mandrel line cuts 188 extending laterally across them. The mandrel line cuts 188 were formed utilizing a single first cut mask on the beta lithographic stack 138 as discussed in reference to FIG. 5.

Select non-mandrel lines 186 have non-mandrel line cuts 190 extending laterally across them. The non-mandrel line cuts 190 were formed utilizing a single second cut mask on the gamma lithographic stack 150 as discussed in reference to FIG. 7.

Advantageously, the ANA region 182 was formed utilizing the first and second cut masks. No additional cut masks were used to make the ANA region. As a result, costs of additional cut masks were avoided as well as the associated lithographic overlay problems associated with the use of additional cut masks.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
   providing a structure having a first hardmask layer, interposer layer, second hardmask layer and mandrel layer disposed respectively over a dielectric stack;
   patterning an array of mandrels into the mandrel layer with a mandrel mask;
   patterning an ANA trench into the mandrel layer with a first cut mask;
   patterning the ANA trench into the interposer layer with a second cut mask;
   disposing an organic planarization layer (OPL) over the structure;
   etching the OPL to dispose the OPL only in the ANA trench such that a top surface of the OPL is lower than the second hardmask layer;
   etching the structure to form a pattern in a dielectric layer of the dielectric stack; and
   forming an array of alternating mandrel and non-mandrel metal lines from the pattern in the dielectric layer, a portion of the pattern formed by the ANA trench forming an ANA region within the dielectric layer.

2. The method of claim 1 comprising:
   disposing a spacer layer over the structure after patterning the ANA trench into the interposer layer; and
   etching the spacer layer to form an array of spacers disposed on sidewalls of the mandrels, to expose top surfaces of the mandrels in the mandrel layer and to expose the first hardmask layer at a bottom of the ANA trench.

3. The method of claim 2 comprising:
   removing the mandrels to expose the second hardmask layer; and
   selectively etching the second hardmask layer to expose the interposer layer without etching away the spacers.

4. The method of claim 3 comprising:
   selectively etching the interposer layer to expose the first hardmask layer without etching away the spacers and OPL, the spacers, OPL and first hardmask layer forming the pattern; and
   anisotropically etching the pattern into the dielectric layer of the dielectric stack.

5. The method of claim 1 comprising:
   forming a beta trench into a mandrel of the mandrel layer with the first cut mask;
   utilizing the beta trench to form a portion of the pattern; and
   forming a mandrel line cut in a mandrel line of the array of metal lines from the portion of the pattern formed by the beta trench.

6. The method of claim 1 comprising:
   forming a gamma trench into the interposer layer between mandrels of the mandrel layer with the second cut mask;
   utilizing the gamma trench to form a portion of the pattern; and
   forming a non-mandrel line cut in a non-mandrel line of the array of metal lines from the portion of the pattern formed by the gamma trench.

7. The method of claim 1 wherein the ANA region extends through the mandrel and non-mandrel metal lines of the array of metal lines.

8. The method of claim 1 wherein the step of etching the OPL comprises etching the OPL selectively relative to the mandrels, interposer layer and the spacers.

9. The method of claim 1 wherein the interposer layer has a predetermined thickness that is thick enough to enable the OPL to be etched in a controlled manner such that:
   the OPL is removed from the entire structure except from that of the ANA trench,
   the top surface of the OPL is lower than a bottom surface of the second hardmask layer, and
   no portion of the first hard mask layer at a bottom of the ANA trench is exposed.

10. The method of claim 1 wherein the interposer layer is a spin-on-hardmask.

11. The method of claim 1 wherein the interposer layer is a spin-on-hardmask.

12. A method comprising:
   providing a structure having a first hardmask layer, interposer layer, second hardmask layer and mandrel layer disposed respectively over a dielectric stack;
   patterning an array of mandrels into the mandrel layer with a mandrel mask;
   patterning a beta trench and an ANA trench into the mandrel layer with a first cut mask;
   patterning a gamma trench and the ANA trench into the interposer layer with a second cut mask;
   disposing an organic planarization layer (OPL) over the structure;
   etching the OPL to dispose the OPL only in the ANA trench;
   etching the structure to form a pattern in the dielectric stack; and forming an array of metal lines from the pattern in the dielectric stack, a portion of the pattern formed by the ANA trench forming an ANA region within the dielectric stack.

13. The method of claim 12 comprising etching the OPL such that a top surface of the OPL is lower than the second hardmask layer.

14. The method of claim 12 comprising:
etching the structure to form the pattern in a dielectric layer of the dielectric stack; and
forming an array of alternating mandrel and non-mandrel metal lines from the pattern in the dielectric layer, the portion of the pattern formed by the ANA trench forming the ANA region in the dielectric layer.

15. The method of claim 14 comprising:
utilizing the beta trench to form a portion of the pattern;
utilizing the gamma trench to form a portion of the pattern;
forming a mandrel line cut in a mandrel line of the array of metal lines from the portion of the pattern formed by the beta trench; and
forming a non-mandrel line cut in a non-mandrel line of the array of metal lines from the portion of the pattern formed by the gamma trench.

16. The method of claim 12 comprising:
disposing a spacer layer over the structure after patterning the ANA trench into the interposer layer; and
etching the spacer layer to form an array of spacers disposed on sidewalls of the mandrels and on sidewalls of the ANA trench, to expose top surfaces of the mandrels in the mandrel layer and to expose the first hardmask layer at a bottom of the ANA trench.

17. The method of claim 16 comprising:
removing the mandrels to expose the second hardmask layer; and
selectively etching the second hardmask layer to expose the interposer layer without etching away the spacers.

18. The method of claim 17 comprising:
selectively etching the interposer layer to expose the first hardmask layer without etching away the spacers and OPL, the spacers, OPL and first hardmask layer forming the pattern; and
anisotropically etching the pattern into a dielectric layer of the dielectric stack.

19. The method of claim 12 wherein the step of etching the OPL comprises etching the OPL selectively relative to the mandrels and the spacers.

20. The method of claim 12 wherein the interposer layer has a predetermined thickness that is thick enough to enable the OPL to be etched in a controlled manner such that:
the OPL is removed from the entire structure except from that of the ANA trench,
the top surface of the OPL is lower than a bottom surface of the second hardmask layer, and
no portion of the first hard mask layer at a bottom of the ANA trench is exposed.

* * * * *